United States Patent [19]
Rajkanan et al.

[11] Patent Number: 5,579,200
[45] Date of Patent: Nov. 26, 1996

[54] ELECTROSTATIC DISCHARGE PROTECTION FOR METAL-OXIDE-SILICON FEEDBACK ELEMENTS BETWEEN PINS

[75] Inventors: Kamal Rajkanan, Fremont; Alex Gyure, Sunnyvale, both of Calif.

[73] Assignee: Zilog, Inc., Campbell, Calif.

[21] Appl. No.: 409,800

[22] Filed: Mar. 24, 1995

Related U.S. Application Data

[63] Continuation of Ser. No. 11,344, Jan. 29, 1993, abandoned.

[51] Int. Cl.$^6$ ........................................ H02H 9/00
[52] U.S. Cl. .......................... 361/111; 361/91; 361/56
[58] Field of Search ............................ 361/56, 58, 91, 361/118, 115, 111; 331/116, 117

[56] References Cited

U.S. PATENT DOCUMENTS

| | | | |
|---|---|---|---|
| 3,979,642 | 9/1976 | Cath et al. | 361/91 |
| 4,048,584 | 9/1977 | Ulmer | 361/91 |
| 4,060,772 | 11/1977 | Yamada | 331/116 |
| 4,605,980 | 8/1986 | Hartranft et al. | 361/56 |
| 4,745,450 | 5/1988 | Hartranft et al. | 361/56 |
| 4,807,080 | 2/1989 | Clark | 361/56 |
| 4,870,530 | 9/1989 | Hurst | 361/91 |

*Primary Examiner*—Jeffrey A. Gaffin
*Assistant Examiner*—Stephen W. Jackson
*Attorney, Agent, or Firm*—Majestic, Parsons, Siebert & Hsue

[57] ABSTRACT

Electrostatic discharge protection circuitry is used to protect a MOS feedback element placed between pins such as oscillator input and an oscillator output pins. The ESD protection circuitry may include a first metal-oxide-silicon field effect transistor whose source and gate are electrically connected to the oscillator input pin and whose drain is electrically connected to the oscillator output pin and a second metal-oxide-silicon field effect transistor whose source and gate are electrically connected to the oscillator output pin and whose drain is electrically connected to the oscillator input pin.

20 Claims, 3 Drawing Sheets

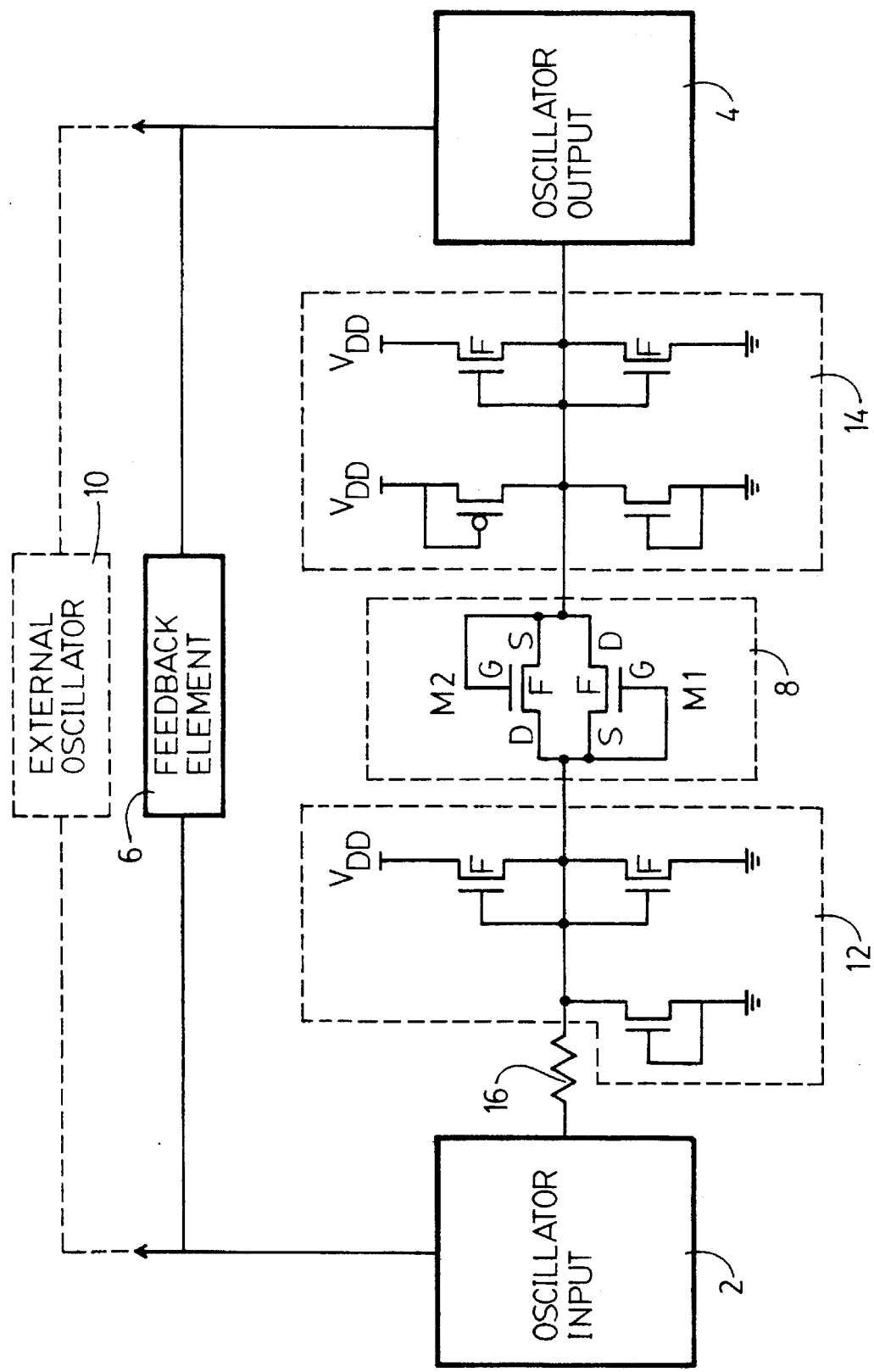
FIG._1.

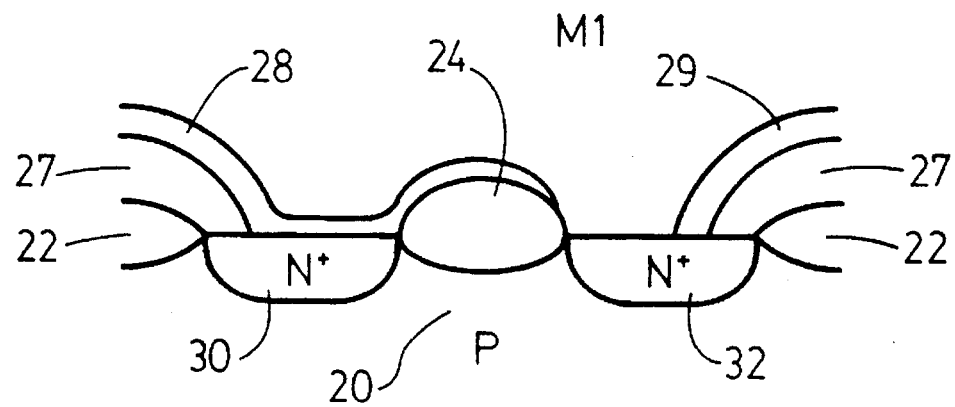
FIG._2.
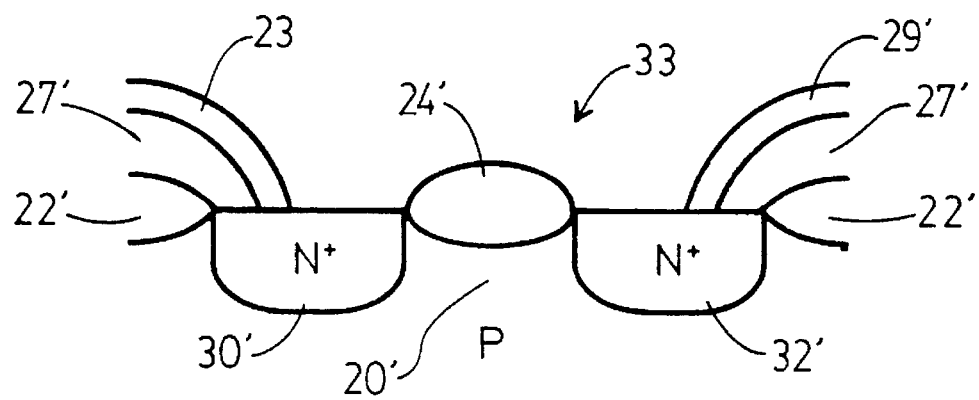
FIG._3(a).
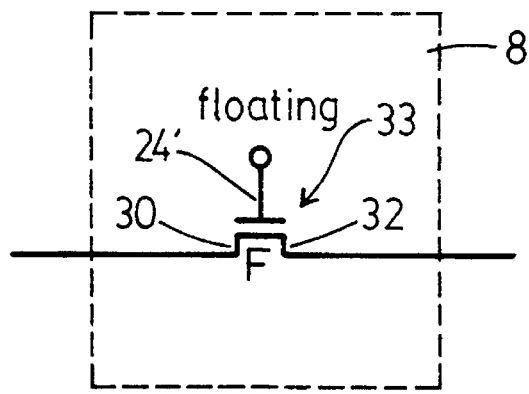
FIG._3(b).

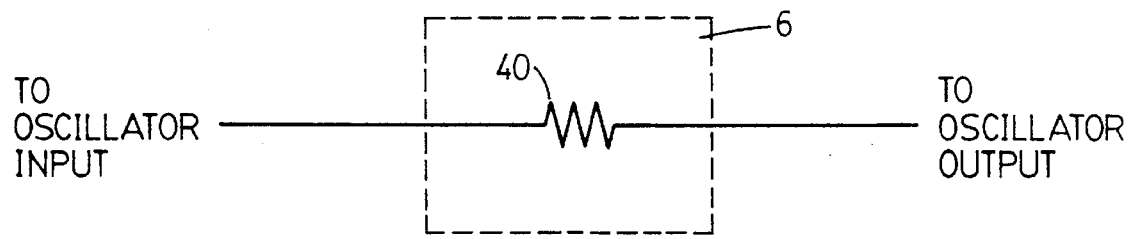
FIG._4.
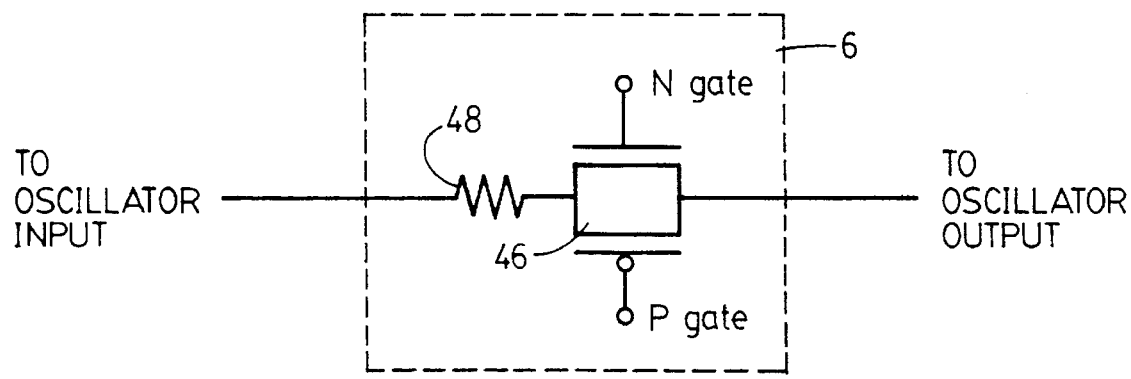
FIG._5(a).
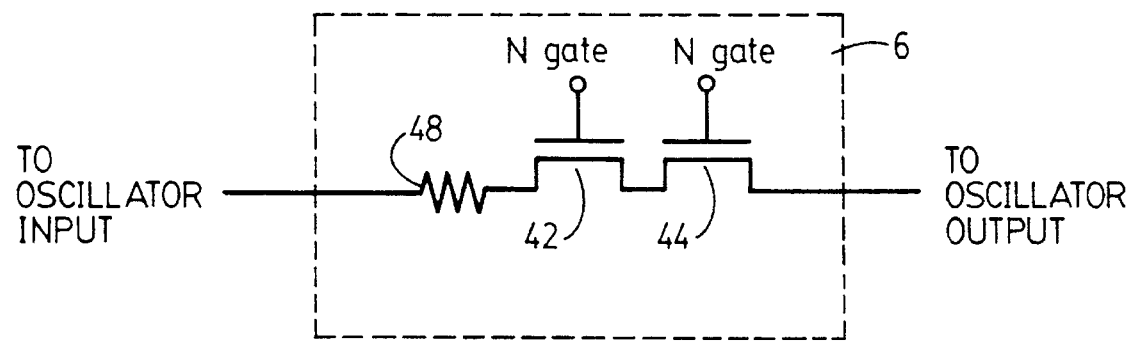
FIG._5(b).

ELECTROSTATIC DISCHARGE PROTECTION FOR METAL-OXIDE-SILICON FEEDBACK ELEMENTS BETWEEN PINS

This is a continuation of application Ser. No. 08/011,344, filed Jan. 29, 1993, now abandoned.

BACKGROUND OF THE INVENTION

This invention relates in general to electrostatic discharge (ESD) protection circuits, and in particular to an electrostatic discharge protection circuit placed between an oscillator input pin and an oscillator output pin to protect a feedback element located between these pins.

In metal-oxide-silicon (MOS) chips, electrostatic discharges caused by human handling of the chips can permanently damage the metal-oxide-silicon field effect transistors (MOSFETs) on the chips. For example, the thin oxide layer that isolates the gate from the substrates in a MOSFET can be ruptured by the ESD voltage surge. Additionally, the metal layer attached to the drain or source diffusion region can spike through this diffusion region to the substrate below. Prior art ESD protection circuitry protects the MOSFETs from ESD voltage surges between a pin and the power and protects the MOSFETs against ESD voltage surges between a pin and the ground.

SUMMARY OF THE INVENTION

Most device pins have no direct path to any neighboring pin. Some pins such as the oscillator input and oscillator output pins however use a feedback element between the pins to provide part of an resistive-capacitive (RC) network used in starting an external oscillator. This feedback element may include MOSFET devices such as n-channel metal-oxide-silicon (NMOS) transistors, or a complementary metal-oxide-silicon (CMOS) pass gate. An electrostatic discharge between an oscillator input pin and an oscillator output pin can cause damage to these MOSFET devices.

The applicant discovered that by using electrostatic discharge protection circuitry between pins in a path parallel to the path containing the feedback element, the feedback element can be protected.

The electrostatic discharge protection circuitry can include a first metal-oxide-silicon field effect transistor whose source and gate are electrically connected to an oscillator input pin and whose drain is electrically connected to the oscillator output pin and a second metal-oxide-silicon field effect transistor whose source and gate are electrically connected to the oscillator output pin and whose drain is electrically connected to the oscillator input pin. These field effect transistors operate as parasitic bipolar transistors to prevent the ESD voltage surge from destroying the feedback element. Additionally, the feedback element can be designed to include a diffused resistor to aid in the parasitic bipolar snapback action of the ESD protection circuitry.

BRIEF DESCRIPTION OF THE DRAWINGS

FIG. 1 is a schematic view of the present invention showing the electrostatic discharge protection circuitry to protect a feedback element between two bond pads.

FIG. 2 is a cross-sectional view of a MOSFET shown in FIG. 1.

FIG. 3(a) is a cross-sectional view of an alternative embodiment of the present invention showing an ESD protection device.

FIG. 3(b) is a schematic view of the ESD protection device of FIG. 3(a).

FIG. 4 is a schematic view of feedback element that can be used to start an external oscillator.

FIGS. 5(a) and 5(b) are schematic views of the preferred feedback elements for use with the ESD protection circuitry shown in FIG. 1.

Similar structures are labelled with a prime (') in the different figures.

DETAILED DESCRIPTION OF THE PREFERRED EMBODIMENT

FIG. 1 is a schematic view of the present invention showing the electrostatic discharge protection circuitry 8 used to protect a feedback element 6 between an oscillator input bond pads 2 and an oscillator output bond pad 4. The present invention, however, is not limited to ESD protection between the oscillator input and oscillator output pins, but is applicable to protect any feedback element placed between pins. The ESD protection circuitry 8 is in a path that is parallel to the path containing the feedback element 6. Bond pad 2 is connected to an oscillator input pin (not shown), and bond pad 4 is connected to an oscillator output pin (not shown). These pins can be attached to an external oscillator 10 shown in phantom. This external oscillator 10 is typically a crystal oscillator attached to the PC board. The feedback element 6 is used to help start the external oscillator 10. A Schmitt trigger (not shown) on the chip triggers the external oscillator 10 using a RC network. The natural capacitance of the external oscillator 10 provides the capacitive element of the RC network and the feedback element 6 is the resistive element of the RC network.

As shown in FIG. 4, this feedback element 6 can be a diffused resistor 40. The diffused resistor feedback element 40 has the disadvantage that once the external crystal oscillator is triggered, a leakage current flows through this diffused resistor feedback element 40.

Preferably, the feedback element 6 includes MOSFET devices such as stacked NMOS transistors 42 and 44 shown in FIG. 5(b), or a complementary metal-oxide-silicon (CMOS) pass gate 46 shown in FIG. 5(a). When the external oscillator is to be triggered, these MOSFET devices shown in FIGS. 5(a) and 5(b) are turned on and have a certain on impedance. The impedance through the feedback element 6 when the MOSFET device are on is increased by an additional diffused resistor 48. The benefit of the additional diffused resistor 48 is described below. Once the external crystal oscillator 10 is started, the MOSFET device can be turned off so that the impedance through the path containing the MOSFET device is very high and no leakage current flows.

If the feedback element 6 includes a MOSFET device, the MOSFET device can be damaged by an electrostatic discharge voltage surge between the oscillator input pin and the oscillator output pin. For example, Military standard, MIL-STD-883C, METHOD 3015.7 requires pin to pin testing that may damage a MOSFET device in the feedback element 6, shown in FIG. 1, if the ESD test is done between the oscillator input pin and the oscillator output pin.

In the preferred embodiment, the electrostatic discharge protection circuitry 8 comprises two MOS field effect transistors M1 and M2. These MOS field effect transistors M1 and M2 use elongated source and drain diffusion regions and an elongated metal gate. A MOS field effect transistor M1 has its source and gate electrically connected to wire bond pad 2 and its drain electrically connected to wire bond pad 4. A MOS field effect transistor M2 has its source and gate electrically connected to wire bond pad 4 and its drain electrically connected to wire bond pad 2.

In normal operation, these field effect transistors M1 and M2 are thick oxide field effect transistors so these transistors M1 and M2 are not turned on by normal voltages at the bond pads 2 and 4. During normal operation, the path containing the ESD protection circuitry 8 isolates bond pad 2 and 4.

An ESD voltage surge at bond pad 2 or 4, causes the transistors M1 and M2 to act as parasitic bipolar transistors. FIG. 2 is a cross-sectional view of transistor MI. Source 30 and drain $32^{N+}$ diffusion regions are formed in a P substrate 20. Field oxide regions 22 are also formed in the P substrate 20. The gate oxide 24 is a thick oxide formed during the field oxide process. The metal layer 28 forms the gate. The metal layer 28 also connects the source 30 to the oscillator input bond pad 2 shown in FIG. 1. A metal layer 29 connects the drain 32 to the oscillator output bond pad 4 shown in FIG. 1.

When the voltage between bond pad 2 and 4 is sufficient, enough current flows between the source 30 and the drain 32 such that the current times the resistance of the substrate 20 will be greater than 0.6 volts. When this occurs, the source-substrate junction is forward biased and the transistor M1 acts as a parasitic n-p-n (source-substrate-drain) bipolar transistor. This parasitic transistor sinks the electrostatic discharge and protects the feedback element 6 shown in FIG. 1.

The feedback element 6 should include a diffused resistor 48 as shown in FIGS. 5(a) and 5(b). The MOSFET devices such as the stacked NMOS transistors 42 and 44 shown in FIG. 5(b), and the complementary metal-oxide-silicon (CMOS) pass gate 46 shown in FIG. 5(a) will act as parasitic bipolar transistors. These MOSFET devices would likely shunt current quicker than the ESD protection circuitry if the diffused resistor 48 was not placed in the feedback element. When current starts flowing through the MOSFET device in the feedback element, an I*R voltage drop is applied between the bond pad inputs because of the diffused resistor 48. As described above, the ESD voltage pulse is discharged through the ESD protection circuitry 8 once a large enough voltage drop is formed across the diffused resistor 48 in feedback element 6. The diffused resistor 48 prevents a large current from flowing through the feedback element 6. Additionally, the diffused resistor 48 ensures that the ESD protection circuitry 8 dissipates the ESD voltage surge. In the preferred embodiment, the diffused resistor 48 has a value of 100–200 Ω.

For the ESD protection circuitry 8, the gate of the transistor does not have to be electrically connected to the bond pad 2 or 4 to cause the parasitic bipolar snapback effect. FIG. 3(a) is a cross-sectional view of an alternative embodiment of the present invention showing an ESD protection device 33. Shown is the $N^+$ doped silicon region 30' electrically connected by metal layer 23 to the first wire bond pad (wire bond pad 2 in FIG. 1), a second $N^+$ doped silicon region 32' electrically connected by metal layer 29' to the second wire bond pad (wire bond pad 4 in FIG. 1); and an intervening P substrate 20' doped region separating the first and second $N^+$ doped silicon regions 30' and 32'.

FIG. 3(b) is a cross-sectional view of the ESD protection device 33 of FIG. 3(a). FIG. 3(b) shows how the ESD protection device 33 can be used as the ESD protection circuitry 8 in FIG. 1. The gate 24' is shown floating.

Secondary protective effects of the transistors M1 and M2 shown in FIG. 1 include the field effect transistor action of these transistors. An ESD voltage surge at bond pad 2, raises the voltage at the gate of the MOS field effect transistor M1 above the transistor's threshold voltage, $V_t$, which is about 20 volts for the thick oxide field effect transistors, so that current begins to flow between transistor M1's source and drain. Similarly, an ESD voltage surge at bond pad 4, raises the voltage at the gate of the MOS field effect transistor M2 above this transistor's threshold voltage, $V_t$, so that current begins to flow between transistor M2's source and drain.

An additional secondary protective effect is the diode breakdown effect which is discussed with respect to FIGS. 2 and 3(a). At about 25 to 26 volts, the $N^+$ diffused region 30 or 30' of the source becomes reverse biased with respect to the P substrate 20 or 20' and current is thereby shunted by the avalanche breakdown of the $N^+$ diffusion region. This effect has an associated capacitive effect so it is slower in nature compared to the ESD protection provided by the parasitic bipolar snapback effect.

Looking again at FIG. 1, additional ESD protection circuitry is shown. ESD protection circuitry 12 protects bond pad 2 from ESD voltage surges between power and the bond pad 2 and between the ground and bond pad 2. ESD protection circuitry 14 protects bond pad 4 from ESD voltage surges between power and the bond pad 4 and between the ground and bond pad 4. Diffused resistor 16 is chosen at a value such that the diffused resistor 48 shown in FIGS. 5(a) and 5(b) will work as described above. In the preferred embodiment, the diffused resistor 16 has a value of 100–200 Ω.

While the invention has been described by reference to various embodiments, it will be understood that various modifications may be made without departing from the scope of the invention, which is to be limited only by the appended claims.

What is claimed is:

1. A circuit on a semiconductor chip, said circuit comprising:

first and second wire bond pads adapted to be electrically connected to an external oscillator;

a feedback element electrically connected between said first and second wire bond pads; and electrostatic discharge protection circuitry electrically connected between said first and second wire bond pads for protecting said feedback element from electrostatic discharge between said first and second wire bond pads, said electrostatic discharge circuitry providing at least one discharge path that does not pass through a power or ground of the circuit when pin-to-pin ESD testing is done between said two bond pads, the electrostatic discharge protection circuitry comprising a first metal-oxide-silicon field effect transistor having a source and gate electrically connected to the first wire bond pad and a drain electrically connected to the second wire bond pad and a second metal-oxide-silicon field effect transistor having a source and gate electrically connected to the second wire bond pad and having a drain electrically connected to the first wire bond pad.

2. The circuit of claim 1, further comprising additional circuitry connected on one side of the electrostatic discharge protection circuitry for protecting the first wire bond pad from electrostatic discharge between power or ground and the first wire bond pad and circuitry connected on the other side of the electrostatic discharge protection circuitry for protecting the second wire bond pad from electrostatic discharge between power or ground and the first wire bond pad, said additional circuitry providing a discharge path to a power or ground.

3. The circuit of claim 1, wherein the first and second field effect transistors act as parasitic bipolar transistors when an electrostatic discharge is applied between the first and second wire bond pads.

4. The circuit of claim 1, wherein the first and second field effect transistors are thick oxide field effect transistors.

5. A circuit on a semiconductor chip, said circuit comprising:
   first and second wire bond pads adapted to be electrically connected to an external oscillator;
   a feedback element electrically connected between said first and second wire bond pads; and
   electrostatic discharge protection circuitry electrically connected between said first and second wire bond pads for protecting said feedback element from electrostatic discharge between said first and second wire bond pads, said electrostatic discharge circuitry providing at least one discharge path that does not pass through a power or ground of the circuit when pin-to-pin ESD testing is done between said two bond pads.

6. The circuit of claim 5, wherein said electrostatic discharge protection circuitry is in a path parallel to a path containing the feedback element.

7. The circuit of claim 5, wherein said first and second wire bond pads are connected to an oscillator input pin and an oscillator output pin, respectively.

8. The circuit of claim 5, further comprising circuitry connected on one side of the electrostatic discharge protection circuitry for protecting the first wire bond pad from electrostatic discharge between power or ground and the first wire bond pad and circuitry connected on the other side of the electrostatic discharge protection circuitry for protecting the second wire bond pad from electrostatic discharge between power or ground and the first wire bond pad.

9. The circuit of claim 5, further comprising additional circuitry connected on one side of the electrostatic discharge protection circuitry for protecting the first wire bond pad from electrostatic discharge between power or ground and the first wire bond pad and circuitry connected on the other side of the electrostatic discharge protection circuitry for protecting the second wire bond pad from electrostatic discharge between power or ground and the first wire bond pad, said additional circuitry providing a discharge path to a power or ground.

10. The circuit of claim 5, wherein said feedback element comprises a resistive element used in the triggering of the external oscillator.

11. The circuit of claim 5, wherein said electrostatic discharge protection circuitry comprises
   a first doped silicon region of a first conductivity type electrically connected to the first wire bond pad;
   a second doped region of the first conductivity type electrically connected to the second wire bond pad; and
   an intervening doped region of a second conductivity type separating the first and second doped silicon regions.

12. The circuit of claim 11, wherein said first doped silicon region and said second doped region are $n^+$ regions and wherein said intervening doped region is a p region.

13. The circuit of claim 5, wherein the discharge path passes through only one active device in series.

14. The circuit of claim 13, wherein the discharge path passes through a thick oxide field effect transistor.

15. The circuit of claim 5, wherein said feedback element comprises a resistive element used in the triggering of an external oscillator.

16. The circuit of claim 15, wherein said feedback element comprises a complementary metal-oxide-silicon pass gate and a diffused resistor.

17. The circuit of claim 15, wherein said feedback element comprises stacked n-channel metal-oxide-silicon field effect transistors and a diffused resistor.

18. A method comprising the steps of:
   providing on a die first and second wire bond pads adapted to be electrically connected to an external oscillator;
   providing a feedback element connected between the two bond pads on a die; and
   protecting the feedback element from electrostatic discharge between said two bond pads by attaching an electrostatic discharge network between the two bond pads, the discharge network providing at least one discharge path that does not pass through a power or ground of the circuit when pin-to-pin ESD testing is done between said two bond pads.

19. The method of claim 18, wherein said feedback element protecting step includes the step of dissipating an electrostatic discharge between the two bond pads with the electrostatic discharge network.

20. The method of claim 18, wherein said feedback element providing step includes the step of providing a diffused resistor in serial with a metal-oxide-silicon field effect transistor.

* * * * *